(12) United States Patent
Rickes et al.

(10) Patent No.: US 6,590,799 B1
(45) Date of Patent: Jul. 8, 2003

(54) ON-CHIP CHARGE DISTRIBUTION MEASUREMENT CIRCUIT

(75) Inventors: Juergen T. Rickes, Cupertino, CA (US); Hugh P. McAdams, McKinney, TX (US); James W. Grace, Los Altos Hills, CA (US); John Y. Fong, Sunnyvale, CA (US); Ralph H. Lanham, Cupertino, CA (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 10/158,279

(22) Filed: May 29, 2002

(51) Int. Cl.[7] ................. G11C 11/22; G11C 11/24; G11C 29/00; G11C 7/00
(52) U.S. Cl. .............. 365/145; 365/149; 365/201; 365/189.09
(58) Field of Search ................ 365/145, 149, 365/201, 189.09

(56) References Cited

U.S. PATENT DOCUMENTS 5,086,412 A * 2/1992 Jaffe et al. ................. 365/145
5,991,189 A * 11/1999 Miwa ........................ 365/145
6,330,180 B2 * 12/2001 Noro et al. ................. 365/145
6,512,686 B2 * 1/2003 Miyamoto ................. 365/145

OTHER PUBLICATIONS

Jeon, Byung–Gil et al., " A 0.4 um 3.3V 1T1C 4Mb Nonvolatile Ferroelectric RAM With Fixed Bit–line Reference Voltage Scheme And Data Protection Circuit" 2000 IEEE International Solid State Circuits Conference, Digest of Technical Papers, Paper TP 16.5, pp. 272–273, Feb. 8, 2000.

Jeon, Byung–Gil et al., " A 0.4 um 3.3–V 1T1C 4–Mb Nonvolatile Ferroelectric RAM With Fixed Bitline Reference Voltage Scheme And Data Protection Circuit" IEEE Journal of Solid–State Circuits, vol. 35, No. 11, pp. 1690–1694, Nov. 2000.

* cited by examiner

Primary Examiner—Trong Phan

(57) ABSTRACT

A method and circuit for measuring a charge distribution for readout from FeRAM cells is fast enough for an on-chip defect detection and parameter adjustment. A comparator-type sense amplifier and a reference voltage generator measure a bit line charge or voltage using one readout of charge from an FeRAM cell and comparisons of the resulting bit line voltage to a series of reference voltages. A series of result signals from the sense amplifier indicates when the bit line voltage is approximately equal to the reference voltage. The results signals can be output for analysis and/or used internally for defect detection or setting of operating parameters such as a reference used during read operations.

20 Claims, 3 Drawing Sheets

ON-CHIP CHARGE DISTRIBUTION MEASUREMENT CIRCUIT

BACKGROUND

A ferroelectric random access memory (FeRAM) generally includes an array of FeRAM cells where each FeRAM cell contains at least one ferroelectric capacitor. Each ferroelectric capacitor contains a ferroelectric material sandwiched between conductive plates. To store a data bit in an FeRAM cell, a write operation applies write voltages to the plates of the ferroelectric capacitor in the FeRAM cell to polarize the ferroelectric material in a direction associated with the data bit being written. A persistent polarization remains in the ferroelectric material after the write voltages are removed and thus provides non-volatile storage of the stored data bit.

A conventional read operation for an FeRAM determines the data bit stored in an FeRAM cell by connecting one plate of a ferroelectric capacitor to a bit line and raising the other plate to a read voltage. If the persistent polarization in the ferroelectric capacitor is in a direction corresponding to the read voltage, the read voltage causes a relatively small current through the ferroelectric capacitor, resulting in a small charge and voltage change on the bit line. If the persistent polarization initially opposes the read voltage, the read voltage flips the direction of the persistent polarization, discharging the plates and resulting in a relatively large charge and voltage increase on the bit line. A sense amplifier can determine the stored value from the resulting bit line current or voltage.

Development, manufacture, and use of an integrated circuit such as FeRAM generally requires testing that determines the characteristics of the integrated circuit and determines whether the integrated circuit is functioning properly. One important test for an FeRAM is measurement of the charge delivered to bit lines when reading memory cells. Generally, the bit line charge or voltage that results from reading an FeRAM cell varies not only according to the value stored in the FeRAM cell but also according to the performance of the particular FeRAM cell being read. Developers of an integrated circuit containing FeRAM arrays often want to measure the distribution of delivered charge because such information is critical to selecting operating parameters that eliminate or minimize errors when reading or writing data. When manufacturing integrating circuits containing FeRAM arrays, measuring the charge distribution can indicate whether a particular integrated circuit is defective or whether a repair operation is required. IC manufacturers could also use the charge distribution measurements to adjust or select operating parameters for optimal performance in a specific IC. Similarly, during use of an FeRAM, an on-chip test that measures the distribution of bit line charge for read operation would be useful to an automated diagnostic of the FeRAM or automatic adjustment of the operating parameters of the FeRAM.

An article by Jeon et al., entitled "A 0.4-$\mu$m 3.3-V 1T1C 4-Mb Nonvolatile Ferroelectric RAM with Fixed Reference Voltage Scheme and Data Protection Circuit", IEEE Journal of Solid-State Circuits, Vol. 35, No. 11, November 2000, describes results from measuring the charge distribution for 4-Megabit FeRAM. For each FeRAM cell, the described measurement included writing a binary value "0" or "1" to the FeRAM cell, charging a reference line to one of a series of charge levels, reading out a charge from the FeRAM cell to a bit line, and sensing whether the bit line or the reference bit line has a higher voltage. The process must repeat charging the reference line and reading out the charge from the FeRAM cell for each of the charge levels used in measuring the distribution. Further, the entire series is repeated for each data value "0" and "1". This charge distribution measurement for a 4-Megabit FeRAM can take several minutes. The time required for the distribution measurement may be acceptable during development of an integrated circuit when a relatively small number of devices are tested, but in production, the lengthy test time can reduce manufacturing throughput and increase costs. For on-chip testing, the lengthy test time is generally unacceptable.

Another problem with current bit line charge distribution measurements for FeRAM is repeated readout of charge from each of the FeRAM cells. The readout operation generally writes-back or refreshes the data value stored in the memory cell. This can lead to inconsistency in the distribution measurement when the charge from an FeRAM cell varies for each readout operation. The repeated readout operations that refresh the data value can also lead to imprinting, which results when repeated writing of the same value changes the response of the memory cell. Further, repeated readout, which refreshes the stored value, can mask retention problems or time-dependent changes in delivered charge since the charge read out almost always corresponds to a freshly written or refreshed data value.

In view of the current limitation of methods for measuring charge distributions of FeRAMs, structures and methods that allow faster determinations of the charge distributions are sought.

SUMMARY

In accordance with an aspect of the invention, an on-chip circuit measures the distribution of bit line voltages or charge resulting from reading FeRAM cells. The measurement employs a comparator-type sense amplifier that without disturbing the bit line voltage compares the bit line voltage to a series of reference voltages (e.g., 100 different levels). For each comparison during testing, the sense amplifier generates a binary result value indicating whether or not the bit line voltage is greater than the current reference voltage. The bit line voltage is kept constant throughout the series of comparisons, which avoids delays, measurement inconsistencies, and endurance problems that arise in conventional processes that repeatedly read an FeRAM cell for a series of comparisons. Measurement times, which are shortened by avoiding repeated readout operations, can be further reduced by simultaneously operating multiple sense amplifiers in the FeRAM to simultaneously test multiple FeRAM cells in an array. The binary result values associated with the comparisons can be output for external analysis or used internally to identify defects or to update or select operating parameters.

The measurement techniques not only provide fast distribution measurements but can also test data retention. One data retention test process writes data values in the FeRAM cells and then bakes the FeRAM or otherwise ages the stored data before performing the charge distribution measurement. Since charge is read out of an FeRAM cell once and measured without refreshing the stored data, the charge distribution measurement accurately reflects the aging of stored data. The aged distribution can be compared to a distribution measured immediately after writing data values in the FeRAM.

The same on-chip circuits and techniques for measuring charge distribution can measure the performance of the sense amplifiers. If the bit line is grounded or biased to a known voltage while stepping the reference voltage through the series of voltage levels, each sense amplifier provides a binary output signal that changes when the reference voltage reaches the level causing the sense amplifier to trip. The distribution of voltages thus measured characterizes the performance of the sense amplifiers and indicates whether any sense amplifiers are defective.

One specific embodiment of the invention is a method for testing an integrated circuit containing FeRAM cells. For each FeRAM cell being tested, the method generally includes: (a) reading out a charge from the FeRAM cell to a bit line; (b) biasing a reference line to a first/next voltage from a series of reference voltages; (c) generating a result signal indicating whether the voltage on the reference line is higher than a voltage on the bit line; and (d) keeping the charge/voltage on the bit line constant while repeating steps (b) and (c) until the reference line has been biased to a last reference voltage of the series. A comparator-type sense amplifier connected to the bit and reference lines can generate the result signal without disturbing the bit line voltage. The test thus quickly generates a series of result signals for each FeRAM cell without repeated readout from each FeRAM cell. Optionally, stored values in the FeRAM can be aged before reading charge from the FeRAM cells.

Each result signal for an FeRAM cell is generally a binary signal and corresponds to one of the reference voltages. The series of reference voltages is generally a monotonic increasing or decreasing series of voltages so that the series of binary result signals for an FeRAM cell changes value (e.g., 0 to 1 or 1 to 0) when the reference voltage approximately matches the bit line voltage arising from reading charge out of the FeRAM cell. The result signals generated thus can be used to determine the bit line voltages read from the FeRAM cells and a charge distribution for readout from the FeRAM cells.

In accordance with another aspect of the invention, on-chip circuits in the integrated circuit perform the tests. The result signals generated by on-chip testing can be output for analysis or used on-chip for defect detection or for on-chip self-tuning that sets operating parameters such as a reference voltage used during read operations.

Another embodiment of the invention is an integrated circuit including: an array of FeRAM cells; a reference voltage generator; sense amplifiers connected to bit lines of the array and to the reference voltage generator; and an on-chip control circuit coupled to the reference voltage generator and the sense amplifier. The on-chip control circuit operates the reference voltage generator and the sense amplifiers to sense bit line voltages and generate data indicating a distribution for charge read out of the FeRAM cells. For fast operation, each sense amplifier leaves the bit line voltage undisturbed when generating a result signal indicating whether the bit line voltage is greater than a reference voltage from the reference voltage generator. In a test mode, the on-chip control circuit causes the reference voltage generator to sequentially supply to the sense amplifiers a series of reference voltages, while bit line voltages remain constant. For each of the reference voltages, each sense amplifier generates a result signal indicating whether a corresponding bit line voltage is greater than that reference voltage.

An on-chip output circuit can directly output the result signals from the sense amplifiers. Instead of or in addition to outputting the result signals, an on-chip adjustment circuit can use the results signals in selecting an operating parameter such as a reference voltage for read operations.

BRIEF DESCRIPTION OF THE DRAWINGS

Use of the same reference symbols in different figures indicates similar or identical items.

DETAILED DESCRIPTION

In accordance with an aspect of the invention, an integrated circuit including an FeRAM array has on-chip circuits capable of measuring a distribution of bit line charge delivered during read operations. The measurement uses comparator-type sense amplifiers that are also used for read operations such as described in co-owned U.S. patent app. No. 10/115,753, entitled "FeRAM with a Single Access/Multiple-Comparison Operation." For a single readout of charge from an FeRAM cell to a bit line, a sense amplifier performs multiple comparisons of the bit line voltage to different reference voltages. The reference voltages decrease or increase in monotonic steps so that the comparison result from the sense amplifier changes when the bit line voltage is about equal to the reference voltage. (The bit line charge is then equal to the product of the measured voltage and the capacitance of the bit line.) Accordingly, the distribution measurement can be performed quickly and accurately without repeated write and readout operations that could modify the performance of the FeRAM cell.

Avoiding repeated readout followed by write-back or refresh operations allows an accurate measurement of the effect that aging has on the charge distribution. In particular, the charge read from each FeRAM cell is the charge after relaxation or aging of the polarization state of the FeRAM cell, and the charge distribution reflects the relaxed or aged properties of the FeRAM array, not the charge distribution of data as refreshed during the measurement. Avoiding repeated writing of the same data value in an FeRAM also avoids imprinting, which could change the charge distribution. Accordingly, the charge distribution measurement using techniques described herein can observe properties of FeRAM that could not be observed with prior charge distribution measurement techniques.

Figure 1:
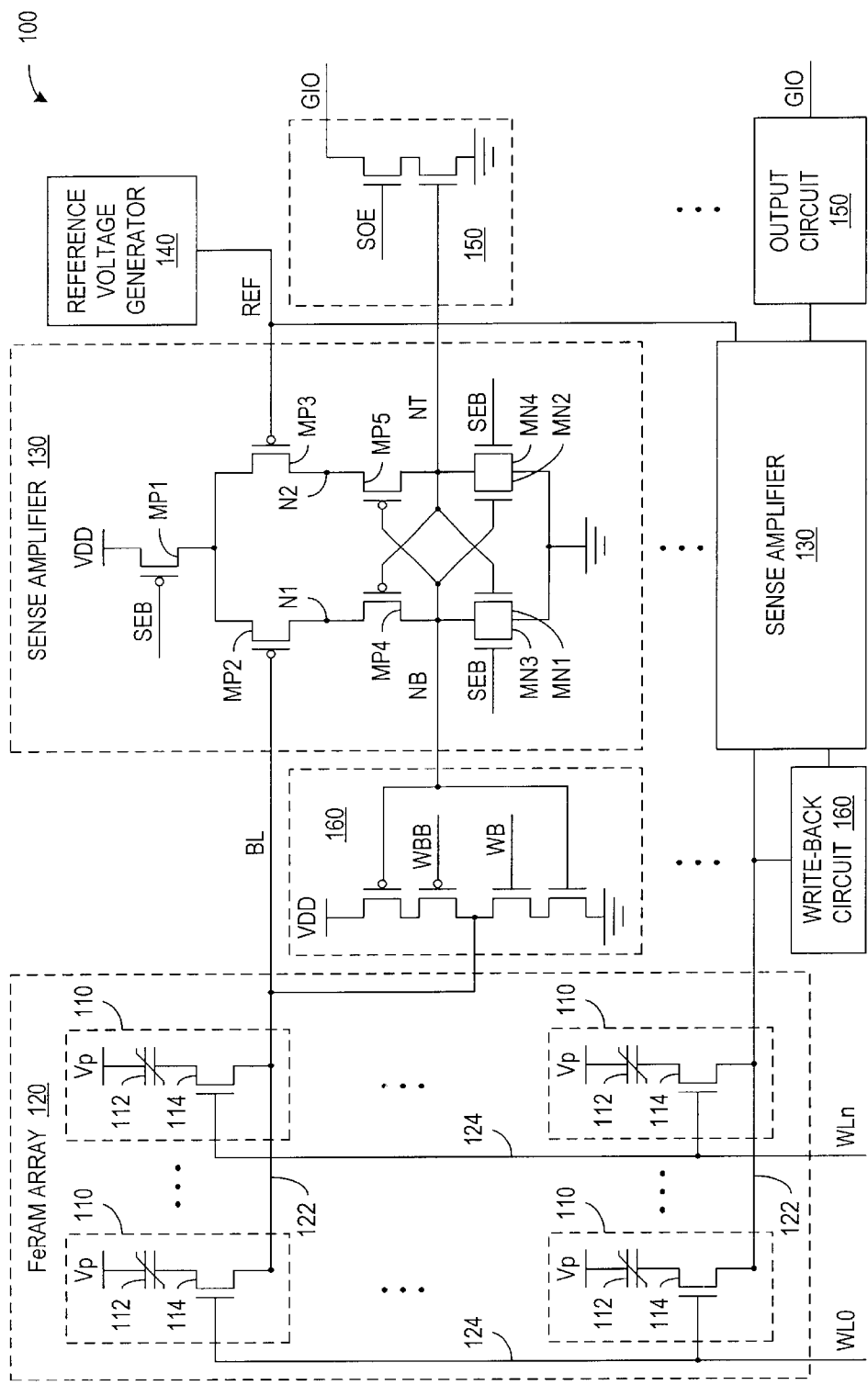
FIG. 1 is a circuit diagram of a portion of an FeRAM associated with reading and measuring bit line charge of FeRAM cells connected to a bit line.

FIG. 1 shows a portion of an FeRAM 100 capable of implementing charge distribution measurements in accordance with the invention. FeRAM 100 contains an FeRAM array 120, sense amplifiers 130, a reference voltage generator 140, global output drivers 150, and write-back circuits 160.

FeRAM array 120 is a conventional array of FeRAM cells 110 that are organized into rows and columns. Each FeRAM cell 110 includes a ferroelectric capacitor 112 and a select transistor 114, which can be fabricated using known techniques. Bit lines 122 connect to drains of select transistors 114 of FeRAM cells 110 in respective columns of the memory array. Word lines 124 connect to the gates of select transistors 114 in respective rows of FeRAM array 120, and conventional row decoder and driver circuits (not shown) control voltages WL0 to WLn on word lines 124 during write, read, and distribution measurement operations. FeRAM array 120 can be one of several local arrays in a memory architecture having local and global decoding circuits (not shown) and having data paths including global input/output lines that connect the local arrays for data input and output.

Each sense amplifier 130 of FIG. 1 is a comparator-type sense amplifier that connects to the corresponding bit line 122. Alternatively, each sense amplifier 130 can connect to local column decoding circuitry that selectively connects one of multiple bit lines 122 to sense amplifier 130 for read operations or for measuring the bit line charge read from an FeRAM cell to the bit line 122.

FIG. 1 further illustrates an implementation of a sense amplifier 130 that includes p-channel transistors MP1, MP2, MP3, MP4, and MP5 and n-channel transistors MN1, MN2, MN3, and MN4. Transistor MP1 serves to activate and deactivate sense amplifier 130 in response to a sense enable signal SEB and is between a supply voltage VDD and transistors MP2 and MP3. Transistors MP2, MP4, and MN1 are connected in series between transistor MP1 and ground, and transistors MP3, MP5, and MN2 are similarly connected in series between transistor MP1 and ground. Transistors MN3 and MN4 are connected in parallel with transistors MN1 and MN2, respectively, and respond to sense enable signal SEB by grounding respective nodes N1 and N2 in preparation for comparison operations.

The gates of transistors MP2 and MP3 respectively receive input signals BL and REF from the corresponding bit line 122 and reference voltage generator 140 respectively. Signal BL is the bit line voltage and depends on the charge read from an FeRAM cell 110 onto the bit line 122 connected to sense amplifier 130. Signal REF is a reference signal having a voltage level that reference voltage generator 140 sets. Reference voltage generator 140 can be any circuit capable of generating a series of different voltage levels for signal REF. Alternatively, signal REF can be input from an external circuit to avoid the need for an on-chip reference voltage generator capable of generating a large number (e.g., 100) of different reference voltage levels.

A voltage difference between bit line signal BL and reference signal REF determines whether transistor MP2 or MP3 is more conductive, which in turn influences whether the voltage on node N1 between transistors MP2 and MP4 or the voltage on node N2 between transistors MP3 and MP5 rises more quickly when sense amplifier 130 is activated. Both transistors MP4 and MP5 are initially on during a sensing operation, so that an output signal NB from a node between transistors MP4 and MN3 and an output signal NT from a node between transistors MP5 and MN4 initially rise at rates depending on the rise in the voltages on nodes N1 and N2, respectively. The gates of transistors MP4, MP5, MN1, and MN2 are cross-coupled, so that transistors MP4, MP5, MN1, and MN2 amplify a voltage difference that develops between output signals NB and NT. As a result, output signal NT is complementary to output signal NB when the sensing operation is complete.

Output circuit 150 receives output signal NT from sense amplifier 130 and in response to an output enable signal SOE drives a global output signal GIO to a level indicating whether bit line signal BL has a voltage greater than the voltage of reference signal REF. In an exemplary embodiment, global output signal GIO is pre-charged to supply voltage VDD, and when output enable signal SEO is activated, output circuit 150 pulls signal GIO down or not depending on the voltage level of output signal NT. As described further below, global output signal GIO sequentially indicates a series of binary values representing the results from comparing bit line signal BL to the series of voltage levels of reference signal REF.

Write-back circuit 160 receives complementary output signal NB, and at the end of a read operation, drives bit line 122 to the appropriate level for writing the data value read from an FeRAM cell back into the FeRAM cell. In FIG. 1, write-back circuit 160 is a tri-state inverter that drives bit line 122 in response to complementary write-back signals WB and WBB. For the distribution measurement, the write-back can be skipped if data is stored in FeRAM cells solely for the distribution measurement. Alternatively, the write-back can be performed after the bit line voltage has been compared to each of the voltage levels of reference signal REF.

Figure 2:
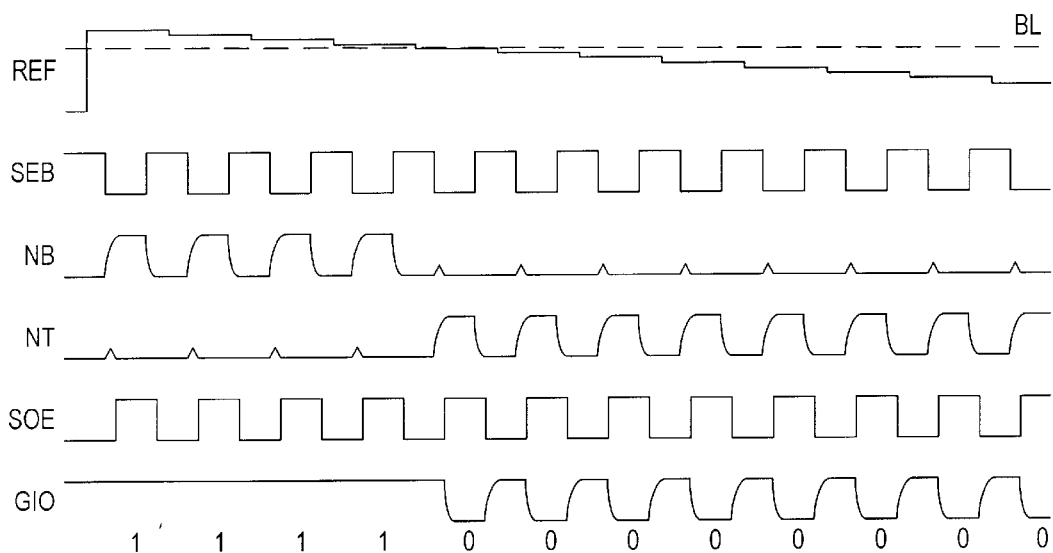
FIG. 2 is a timing diagram for selected signals in the FeRAM of FIG. 1.

FIG. 2 shows timing diagrams for selected signals during a measurement that determines a bit line voltage or charge resulting from reading a particular FeRAM cell. For the measurement, reference signal REF steps through a series of voltage levels corresponding to different charges on a bit line. Generally, the range of the voltage levels will depend on the properties of the FeRAM cells and particularly the expected range of bit line voltages that may be read out of the FeRAM cells. In an exemplary embodiment, signal REF ranges from 0.5 V to 0 V in 100 steps of about 5 mV. FIG. 2 shows an example where reference signal REF starts at the upper limit of the voltage range and steps down, but reference signal could increase in steps from the lower voltage limit or change in any desired pattern.

Bit line voltage BL is read out from an FeRAM cell 110 to a bit line 122 and remains constant while being measured. To measure a charge distribution for FeRAM cells storing the value "0", the value "0" is written to all of the FeRAM cells before being read out for testing. To measure a charge distribution for FeRAM cells storing the value "1", the value "1" is written to all of the FeRAM cells before being read out for testing. Alternatively, instead of reading charge out of FeRAM cells to the bit lines, the bit lines can be grounded to measure or test the operation of the sense amplifier.

Sense amplifier enable signal SEB is activated (low) in a series of intervals during which the voltage of reference signal REF remains constant. When signal SEB is active, the sense amplifier 130 connected to the bit line 122 being measured compares signals BL and REF. Depending on whether signal BL or REF is at a higher voltage, node voltage NB or NT rises to supply voltage VDD, and the other node voltage NT or NB settles back to 0 volts after the sensing period. Since the repeated sensing operations do not need to wait for readout from an FeRAM cell, the period of signal SEB is typically active for about 4 ns, which is sufficient to include the sensing time (1–2 ns) of a typical implementation of sense amplifier 130 and the operation of output circuit 150.

Sense output enable signal SOE signal is activated (high) a short delay, typically about 1–2 ns, after sense enable signal SEB becomes active (low). The delay is sufficient for node voltages NT and NB to settle to the levels indicating the results of the comparison of signals BL and REF. As a result, output circuit 150 drives output signal GIO to a binary level indicating whether signal BL or REF has the greater voltage.

During the series of intervals when sense output signal SOE is activated, output signal GIO indicates a series of binary values indicating the results of the voltage comparisons. As a result for 100 different voltage levels of reference signal REF, signal GIO serially provides 100 bits of data representing different comparison results. As shown in FIG. 2, for the case where reference signal REF consistently steps down (or up), a bit stream associated with bit line signal BL has a one binary value (e.g., "1") until reference signal REF falls below the voltage of bit line signal BL. Thereafter, the bit stream is expected to have the other binary value (e.g., "0"), but noise or variations in the circuitry may cause the new binary values of output signal GIO to alternate when signals REF and BL have approximately the same voltage.

The measurement of bit line voltages for multiple bit lines can be conducted simultaneously resulting in output of parallel bit streams representing comparison results. The number of parallel bit streams is generally limited by the number of sense amplifiers that can be operated in parallel or by the width of the global data paths in the FeRAM. In an exemplary embodiment of the invention, 64 comparisons are conducted simultaneously, and a 64-bit output signal GIO<63:0> represents comparison results.

The comparison results represented by output signal GIO<63:0> can be directly output for analysis, but a complete measurement of the bit line charge distribution for a large FeRAM can require transfer of a significant amount of data. In particular, for 100 different reference levels, each row of sixty-four FeRAM cells provides sixty-four 100-bit values. A complete charge distribution measurement of a binary FeRAM measures a bit line voltage twice for each FeRAM cell, once when the FeRAM cell store binary value "0" and once when the FeRAM cell stores binary value "1". A charge distribution measurement for 4-Megabit FeRAM thus performs over 800 million comparisons. Even when performing 64 comparisons in parallel, the charge distribution measurement can take to much time for many applications unless the average time per comparison is very short.

In accordance with an aspect of the invention, the time required for each comparison is reduced because multiple (e.g., 100) comparisons require only one readout from an FeRAM cell. The period or cycle time for comparison results output can be about 8 ns for a current comparator-type sense amplifier. In contrast, conventional measurements of the bit line charge have required reading out the charge from an FeRAM cell each time the bit line charge is compared to a reference. With the conventional measurements, the period or cycle time for each comparison must include the readout time and the sensing time.

Figure 3:
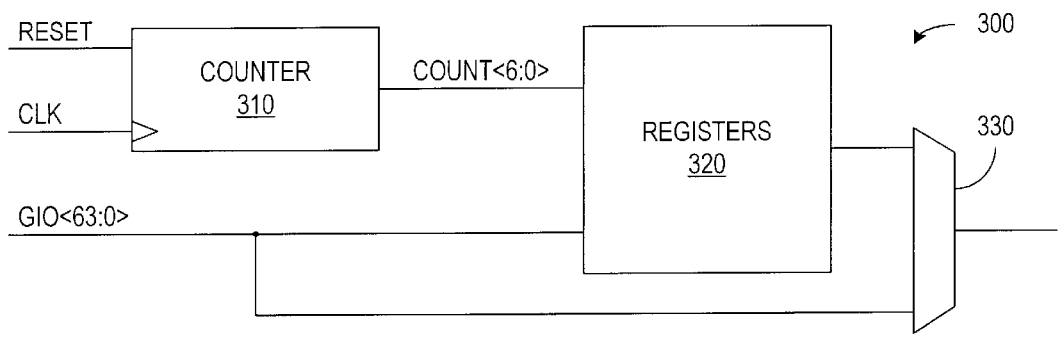
FIG. 3 is a block diagram of a compression circuit that processes result signals from a charge distribution measurement to reduce the amount of test data.

On-chip processing or compression of result signals can reduce the total amount of data output for evaluation of the charge distribution. FIG. 3 is a block diagram of a compressor circuit 300 that compresses the result signals characterizing the charge distribution. Compressor circuit 300 includes a counter 310, a set of count registers 320, and output multiplexer 330.

Counter 210 is reset each time bit line charges are read out of a set of FeRAM cells. At the same time, reference signal REF is set to its initial value. Counter 210 increments a count signal COUNT<6:0> each time output signal GIO<63:0> provides 64-bits of new comparison results. The value of count signal COUNT<6:0> is thus synchronized with changes in the reference signal REF and indicates the reference voltage level corresponding to the current comparison results that output signal GIO<63:0> represents.

During the simultaneous measurements of bit line voltages, each bit of data output signal GIO<63:0> corresponds to a different bit line and provides a series of binary values indicating whether the voltage of bit line signal BL or reference signal REF is greater. In an exemplary embodiment, registers 220 include a set of 64 registers that correspond to respective bits of signal GIO<63:0>. Each register in the set latches the value of count signal COUNT<6:0> if the register is enabled when the count signal COUNT<6:0> changes. The bits of signal GIO<63:0> act as the enable signals for the respective registers, and in the exemplary embodiment, a bit of value "1" (indicating the voltage of signal REF is greater than the voltage of signal BL) enables the corresponding register to latch the new count value; and a bit of value "0" (indicating the voltage of signal BL is greater than the voltage of signal REF) disables latching in the corresponding register. In this embodiment of the invention, the count value stored in a register after completion of a series of comparisons will be equal to the count corresponding to the last comparison for which the voltage of reference signal REF was greater than the voltage of bit line signal BL. Accordingly, the stored value indicates the approximate bit line voltage read out of the memory cell. The 100 bits associated with the testing of a bit line voltage are thus reduced to seven bits when the only information required is the approximate bit line voltage.

Other information can similarly be extracted from the bit streams. For example, a second set of registers can be connected to latch the count value only the first time that the respective bits of signal GIO<63:0> are zero. A count in a register in the second set of registers would record another indication of the approximate bit line voltage of a corresponding bit line. If a clean transition occurred so that the 100-bit results stream associated with a bit line contains all ones up to a point after which the results stream includes all zeros, the count in the second register set would be one greater than the corresponding count in the first register set. However, if the bit values in the 100-bit data stream alternate indicating variation in the performance the sense amplifier 130 or other components of the FeRAM, the count in the second register set will be less than the count in the first register set and the difference between the two counts suggests the magnitude of the variations.

The above-described embodiment of a compressor circuit provides merely one example structure for extracting specific information from bit streams representing comparison results.

Figure 4:
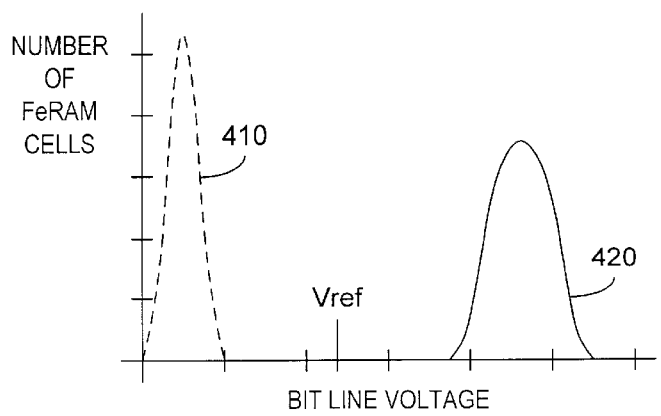
FIGS. 4 and 5 illustrate bit line charge distributions measured for FeRAM arrays.

FIG. 4 illustrates a typical bit line voltage distribution for an FeRAM. The illustrated voltage distributions include a distribution 410 for the binary value (e.g., "0") that corresponds to each ferroelectric capacitor having a polarization that is not flipped during read and a distribution 420 for the binary value (e.g., "1") that corresponds to each ferroelectric capacitor having a polarization that is flipped during read. Measuring charge distribution 410 can be performed by first writing a zero into all of the FeRAM cells. Charge is then read out of each FeRAM cell in turn, and a bit line voltage is measured for each FeRAM cell using the techniques described above. To measure the charge distribution 420, ones are written into all of the memory cells, and again the charge is read out of each FeRAM cell to provide a bit line voltage that is measured using the techniques described above.

In FIG. 1, distributions 410 and 420 are cleanly separated, which permits selection of a read reference voltage Vref for read operations. During read operation, reference generator 140 sets the reference signal REF at reference voltage Vref, and sense amplifier 130 compares the bit line signal BL that results from the charge read out from an FeRAM cell 110.

Signal BL being greater than read reference voltage Vref indicates one binary value (e.g., one), and signal BL being less than read reference voltage Vref indicates the other binary value (e.g., zero).

In accordance with an aspect of the invention, operational parameters such as the read reference voltage Vref can be set to provide the most reliable read operations for the bit line voltage distribution found as part of the testing of the integrated circuit during manufacture or during a power-up self test. The read reference voltage Vref can thus be set specifically for each FeRAM array during manufacture and can be updated periodically as FeRAM cells fatigue. The measurement, analysis, and updates were not previously practicable because of the length of time required for measurements- of the distributions of readout bit line voltage or charge.

Figure 5:
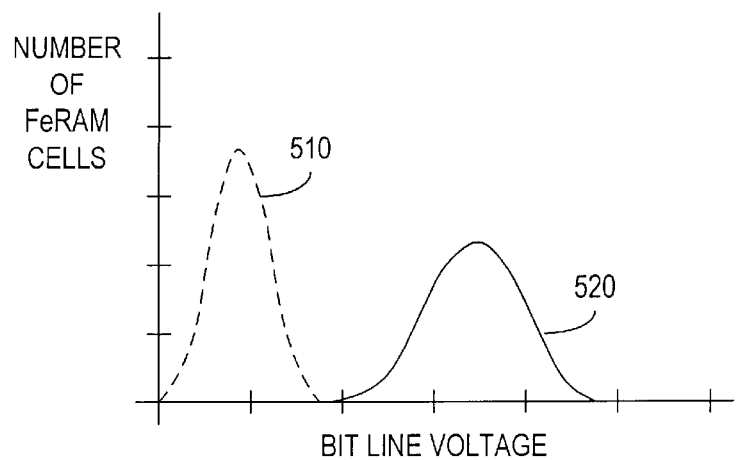

FIG. 5 illustrates a bit line voltage or charge distribution which lacks a clean separation between a distribution 510 corresponding to binary value "0" and a distribution 520 corresponding to binary value "1". During manufacture of an integrated circuit, a test process finding a bit line voltage distribution as illustrated in FIG. 4 or 5 can determine whether the integrated circuit is defective or requires repair. The repair operation could then identify FeRAM cells that provide low bit line voltages for stored value "1" or high bit line voltages for stored value "0" and replace those FeRAM cells with redundant cells that will allow selection of a read reference voltage that dependably separates bit line voltages corresponding to different data values.

Charge distributions 410 and 420 of FIG. 4 and charge distributions 510 and 520 of FIG. 5 measured using the above techniques can reflect the aging on an FeRAM. In particular, if the polarization of the ferroelectric material in an FeRAM cell changed since a value was written in the FeRAM cell, the charge first read from the FeRAM cell reflects that change. Prior measurement techniques that repeat reading out the charge from an FeRAM cell, refresh the FeRAM cell's polarization state and eliminate the effect of aging. In accordance with an aspect of the invention, a charge distribution measurement measures the first charge read out of an FeRAM cell. This allows use of the distribution measurement to test data retention. In particular, an FeRAM can be baked or otherwise aged between writing data in the FeRAM and measuring the charge distribution of the FeRAM. An FeRAM having the charge distributions of FIG. 5 after aging and the charge distributions of FIG. 4 before aging could thus indicate a data retention failure of the FeRAM.

Figure 6:
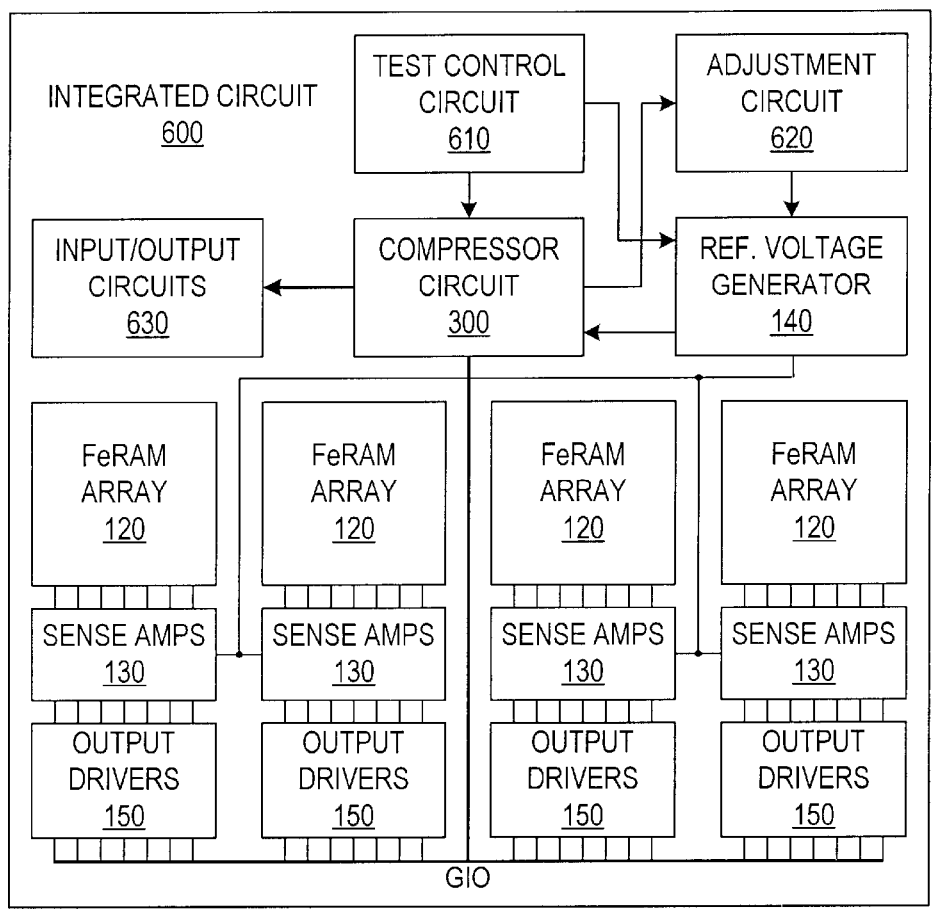
FIG. 6 is a block diagram of an integrated circuit including on-chip circuits for measuring a distribution for charge read out from FeRAM cells, outputting results signals indicating the charge distribution, and on-chip adjustment circuits that set operating parameters according to the measured charge distribution.

The above-described distribution measurement techniques can be implemented in an integrated circuit for on-chip testing. FIG. 6, for example, is a block diagram of an integrated circuit 600, which can generally be a memory chip or any type of integrated circuit using an embedded FeRAM for nonvolatile storage. Integrated circuit 600 includes FeRAM arrays 120, sense amplifiers 130, a reference voltage generator 140, output drivers 150, and a compressor circuit 300 having structures and functions described above. Integrated circuit 600 further includes a test control circuit 610, a parameter adjustment circuit 620, and input/output circuits 630 that further implement on-chip control and use of charge distribution measurements.

Test control circuit 610 is a state machine or other well-known type of control circuit that controls charge distribution measurements. In a test mode of integrated circuit 600, test control circuit 600 controls FeRAM arrays 120, reference voltage generator 140, and sense amplifiers 130 to measure the bit line voltages read out of FeRAM cells and controls output, compression, and/or internal use of measurement results. In particular, control circuit 660 selects which FeRAM cells will be used in the charge distribution measurements. Accordingly, charge distributions can be separately measured for each FeRAM array 120, and a charge distribution measurement can be limited to a sampling of the FeRAM cells in an array rather than including all FeRAM cells in the array.

Multiple bit line voltage measurements for the charge distribution measurement can be performed in parallel. For this, test control circuit 600 directs one of the FeRAM arrays 120 to read out charge from a set of FeRAM cells on a word line and then directs reference voltage generator 140 to begin stepping the reference voltage. Sense amplifiers 130 associated with the selected FeRAM cells simultaneously output result signals as parallel bit streams. As noted above, the bit streams can be directly output through I/O circuits 630 for external analysis or compressed in compressor 300 before output through I/O circuits 630. Test control circuit 610 then repeatedly selects the next set of FeRAM cells for bit line voltage measurements until the charge distribution measurement is complete.

Adjustment circuit 620 can receive and use the result signals (compressed or otherwise) for defect detection or for setting operating parameters. In one embodiment, adjustment circuit 620 includes a first register that records the highest bit line charge or voltage read out of an FeRAM cell storing the data value (e.g., "0") corresponding to the polarization of a ferroelectric capacitor that is not flipped during reading. A second register records the lowest bit line charge or voltage read out of an FeRAM cell storing the data value (e.g., "1") corresponding to the polarization of a ferroelectric capacitor that is flipped during reading. Parameter adjustment circuit 620 can detect a defect if the highest bit line voltage associated with reading an unflipped ferroelectric capacitor is greater than or too close to the lowest bit line voltage associated with a ferroelectric capacitor flipped during reading. If the separation between the recorded values is acceptable, adjustment circuit 620 can select a reference voltage for read operation to be between the values in the two registers.

The preceding paragraph merely gives example functions of adjustment circuit 620. Adjustment circuit 620 could perform more complicated analysis of the charge distribution measurements. For example, error detection and the reference voltage setting can be performed separately for each FeRAM array 120 and the characterization of the charge distribution used in error detection and parameter setting can use more than just the maximum and minimum bit line voltages for the different data values.

In an alternative test mode of integrated circuit 600, test control circuit 610 controls biasing of the bit lines to a known voltage (e.g., ground) while the reference voltage steps through a series of voltage levels. With ideal operation, the output signals of the sense amplifiers being simultaneously tested should all change binary level when the reference voltage rises above the known bit line voltage. An actual circuit will generally require different reference voltage levels to operate the different sense amplifiers. A sense amplifier is identified as defective if a large voltage difference between the bit line and reference line is required to operate the sense amplifier within the required sensing time. A distribution that characterizes the range in the performance of working sense amplifiers can be determined in manner similar to the charge distribution measurements described above, in particular, by measuring the distribution of reference voltages required to change the outputs signals from the sense amplifiers.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A method for testing an integrated circuit containing FeRAM cells, comprising:
   (a) reading out a charge from one of the FeRAM cells to a bit line;
   (b) biasing a reference line to a first/next voltage from a series of voltages;
   (c) generating an output signal indicating whether the first/next voltage on the reference line is higher than a voltage on the bit line;
   (d) keeping the charge on the bit line constant while repeating steps (b) and (c) until reference line has been biased to a last voltage level of the series of voltages; and
   (e) repeating steps (a) to (d) for each of the FeRAM cells.

2. The method of claim 1, wherein on-chip circuits in the integrated circuit perform steps (a) through (e).

3. The method of claim 1, further comprising (f) using the output signals generated in step (b) to determine a distribution for readout of the FeRAM cells.

4. The method of claim 3, further comprising selecting an operating parameter of the integrated circuit according to the distribution determined.

5. The method of claim 4, wherein the operating parameter is a reference voltage applied to the reference line when reading a data value out of one of the memory cells.

6. The method of claim 1, wherein the series of voltages is a monotonic decreasing or increasing series.

7. The method of claim 6, wherein a difference between successive voltages in the series is constant.

8. The method of claim 6, wherein repeating step (c) for one of the FeRAM cells generates a series of binary values, and a transition from a first binary value to a second binary value indicates an approximate amount for the charge read out of the FeRAM cell.

9. The method of claim 1, further comprising:
   writing data values to the FeRAM cells; and
   aging the FeRAM between writing the data values and beginning steps (a) through (e).

10. The method of claim 1, further comprising:
    writing a first value to all of the FeRAM cells before executing steps (a) through (e);
    writing a second value to all of the FeRAM cells; and then repeating steps (a) through (e).

11. The method of claim 1, wherein generating the output signal comprises operating a comparator-type sense amplifier that is connected to the bit line and the reference line.

12. A method for testing an integrated circuit containing FeRAM cells, comprising:
    (a) setting a voltage on a bit line connected to a sense amplifier;
    (b) biasing a reference line to the sense amplifier at a first/next voltage from a series of voltages;
    (c) generating an output signal from the sense amplifier indicating whether the first/next voltage on the reference line is higher than a voltage on the bit line; and
    (d) keeping the charge on the bit line constant while repeating steps (b) and (c) until reference line has been biased to a last voltage level of the series of voltages.

13. The method of claim 12, wherein setting the voltage on the bit line comprises reading out a charge from one of the FeRAM cells to the bit line and the method further comprises:
    repeating steps (a) to (d) for a set of FeRAM cells; and
    determining a charge distribution from the output signals.

14. The method of claim 12, wherein setting the voltage on the bit line comprises biasing the bit line at a fixed voltage, and the method further comprises:
    repeating steps (a) to (d) for each sense amplifier in the integrated circuit; and
    characterizing performance of the sense amplifiers based on the output signals.

15. An integrated circuit comprising:
    an array of FeRAM cells including bit lines coupled to respective columns of the FeRAM cells;
    a reference voltage generator;
    sense amplifiers connected to the bit lines and the reference voltage generator; and
    an on-chip control circuit coupled to the reference voltage generator and the sense amplifier, wherein the on-chip control circuit operates the reference voltage generator and the sense amplifiers to measure a distribution for charge read out of the FeRAM cells.

16. The integrated circuit of claim 15, wherein each sense amplifier leaves a voltage on a bit line undisturbed when generating an output signal indicating whether the voltage on the bit line is greater than a voltage from the reference voltage generator.

17. The integrated circuit of claim 15, wherein the on-chip control circuit has a test mode in which the on-chip control circuit causes the reference voltage generator to sequentially supply to the sense amplifiers a series of reference voltages, the sense amplifiers generating for each of the reference voltages a result signal indicating whether a bit line voltage is greater than that reference voltage.

18. The integrated circuit of claim 17, further comprising an output circuit that outputs the result signals from the sense amplifiers.

19. The integrated circuit of claim 17, further comprising an adjustment circuit that selects an operating parameter for the integrated circuit, wherein the adjustment circuit selects the operating parameter based on the result signals.

20. The integrated circuit of claim 19, wherein the operating parameter is a reference voltage used in reading data from the FeRAM cells.

* * * * *